United States Patent
Kim et al.

(10) Patent No.: US 10,645,828 B2
(45) Date of Patent: *May 5, 2020

(54) DISPLAY APPARATUS

(71) Applicant: SAMSUNG ELECTRONICS CO., LTD., Suwon-si (KR)

(72) Inventors: Hyung Kuk Kim, Seoul (KR); Hong Gyun Kim, Seoul (KR); Sang Goo Lee, Suwon-si (KR); Sang In Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

This patent is subject to a terminal disclaimer.

(21) Appl. No.: 16/188,398

(22) Filed: Nov. 13, 2018

(65) Prior Publication Data

US 2019/0098784 A1 Mar. 28, 2019

Related U.S. Application Data

(63) Continuation of application No. 15/654,212, filed on Jul. 19, 2017, now Pat. No. 10,165,697.

(30) Foreign Application Priority Data

Aug. 31, 2016 (KR) .......................... 10-2016-0111453

(51) Int. Cl.
*G06F 1/16* (2006.01)
*H04N 5/655* (2006.01)
(Continued)

(52) U.S. Cl.
CPC ........... *H05K 5/0234* (2013.01); *F16M 11/00* (2013.01); *F16M 11/10* (2013.01); *F16M 11/24* (2013.01);
(Continued)

(58) Field of Classification Search
None
See application file for complete search history.

(56) References Cited

U.S. PATENT DOCUMENTS 5,918,845 A * 7/1999 Whitaker ............... A47B 11/00
248/288.11
6,563,705 B1 * 5/2003 Kuo .......................... G06F 1/16
349/58
(Continued)

FOREIGN PATENT DOCUMENTS

EP 2149865 A1 2/2010
EP 2752611 A2 7/2014
(Continued)

OTHER PUBLICATIONS

International Search Report dated Nov. 2, 2017, issued by the International Searching Authority in International Patent Application No. PCT/KR2017/006513 (PCT/ISA/210).
(Continued)

*Primary Examiner* — Xanthia C Cunningham
(74) *Attorney, Agent, or Firm* — Sughrue Mion, PLLC

(57) ABSTRACT

A display apparatus, including a chassis, a display panel provided on a first side of the chassis, a connection unit coupled to a second side of the chassis, the connection unit including a bracket link configured to connect to a stand, a rear cover provided on the second side of the chassis, the rear cover including a first through hole through which the bracket link extends to connect to the stand, and wherein the connection unit is configured to perform at least one of tilting and sliding of the chassis with respect to the stand by movement of the bracket link along the first through hole.

16 Claims, 10 Drawing Sheets

(51) Int. Cl.
    *H05K 5/02*     (2006.01)
    *F16M 13/02*    (2006.01)
    *F16M 11/10*    (2006.01)
    *F16M 11/24*    (2006.01)
    *H05K 5/00*     (2006.01)
    *F16M 11/00*    (2006.01)

(52) U.S. Cl.
    CPC ........... *F16M 13/02* (2013.01); *G06F 1/1601* (2013.01); *H05K 5/0017* (2013.01); *F16M 2200/041* (2013.01); *F16M 2200/048* (2013.01); *H04N 5/655* (2013.01)

(56) References Cited

U.S. PATENT DOCUMENTS

| | | | | |
|---|---|---|---|---|
| 7,068,497 B2* | 6/2006 | Chu | ............... | F16M 11/046 248/919 |
| 7,180,731 B2* | 2/2007 | Titzler | ............... | G06F 1/1601 361/679.22 |
| 7,801,580 B2* | 9/2010 | Cho | ............... | H04M 1/0239 361/679.01 |
| 8,289,683 B2* | 10/2012 | Wang | ............... | G06F 1/181 361/679.02 |
| 8,387,930 B2* | 3/2013 | Drew | ............... | F16M 11/046 248/157 |
| 8,648,821 B2* | 2/2014 | Wu | ............... | G06F 1/1601 345/173 |
| 8,960,627 B2* | 2/2015 | Atallah | ............... | F16M 11/04 248/299.1 |
| 9,134,758 B2* | 9/2015 | Chen | ............... | G06F 1/1616 |
| 2006/0238966 A1* | 10/2006 | Sung | ............... | F16M 11/046 361/679.05 |
| 2007/0217135 A1* | 9/2007 | Chuang | ............... | G06F 1/1626 361/679.05 |
| 2008/0207272 A1* | 8/2008 | Thornton | ............... | H04M 1/0239 455/566 |
| 2009/0166482 A1* | 7/2009 | Gan | ............... | F16M 11/14 248/122.1 |
| 2009/0244872 A1* | 10/2009 | Yan | ............... | H04M 1/04 361/807 |
| 2011/0001734 A1* | 1/2011 | Kim | ............... | H05K 5/02 345/204 |
| 2011/0069055 A1* | 3/2011 | Jung | ............... | H04N 5/64 345/211 |
| 2011/0164394 A1* | 7/2011 | Hwang | ............... | H05K 5/02 361/818 |
| 2015/0145837 A1* | 5/2015 | Park | ............... | H04N 5/64 345/184 |
| 2015/0366090 A1* | 12/2015 | You | ............... | F16M 11/00 361/809 |
| 2015/0382491 A1* | 12/2015 | Ye | ............... | F16M 11/046 248/457 |
| 2016/0125984 A1 | 5/2016 | Huang et al. | | |
| 2016/0218316 A1 | 7/2016 | Lee et al. | | |
| 2016/0296018 A1* | 10/2016 | Ahn | ............... | F16M 11/041 |
| 2017/0192293 A1* | 7/2017 | Lee | ............... | G02F 1/133308 |
| 2017/0234478 A1* | 8/2017 | Ren | ............... | F16M 11/38 361/679.56 |
| 2017/0303425 A1* | 10/2017 | Jung | ............... | F16M 11/10 |

FOREIGN PATENT DOCUMENTS

| | | |
|---|---|---|
| KR | 10-2007-0021768 A | 2/2007 |
| KR | 10-2010-0039040 A | 4/2010 |
| KR | 10-2010-0047595 A | 5/2010 |
| KR | 10-2011-0017162 A | 2/2011 |
| WO | 2007117060 A2 | 10/2007 |

OTHER PUBLICATIONS

Communication dated May 24, 2019, issued by the European Patent Office in counterpart European Application No. 17846812.0.

\* cited by examiner

DISPLAY APPARATUS

CROSS-REFERENCE TO RELATED APPLICATION

This is a continuation of U.S. patent application Ser. No. 15/654,212, filed Jul. 19, 2017 which claims priority from Korean Patent Application No. 10-2016-0111453, filed on Aug. 31, 2016 in the Korean Intellectual Property Office, the disclosure of which is incorporated herein by reference in its entirety.

BACKGROUND

1. Field

Exemplary embodiments of the present disclosure relate to a display apparatus, and more particularly, to a display apparatus having a bracket link of a connection unit connected to a stand.

2. Description of Related Art

Recently, the resolution of a screen displaying content in a display apparatus has increased, and the size of the screen has also been enlarged. Further, the display apparatuses have become thinner and may have a curved screen.

The screen ratio of a large-screen display apparatus (or a curved display apparatus) has also become diversified, for example to 4:3, 16:9, 16:10, and 21:9. Content having resolution of, for example, 3480 pixels×2160 pixels or more may have a screen ratio of 16:9. Also, the large-screen display apparatus (or the curved display apparatus) can pivot to rotate the display unit of the display apparatus using a stand, tilt to tilt the display unit forward or backward, swivel to rotate the display unit to the left or right, and/or adjust the height of the display unit.

SUMMARY

One or more exemplary embodiments provide a display apparatus capable of providing a wide angle of view in an up-down direction using a connection unit coupled with a bottom chassis and connected to an external stand.

One or more exemplary embodiments also provide a display apparatus capable of being easily repaired using a connection unit coupled with a bottom chassis and connected to an external stand.

One or more exemplary embodiments also provide a display apparatus in which a stand can be easily repaired through a connection unit coupled with a bottom chassis and connected to an external stand.

One or more exemplary embodiments also provide a display apparatus having an embedded connection unit coupled with a bottom chassis and connected to an external stand.

One or more exemplary embodiments also provide a display apparatus having a rear cover implemented as a clean back design using an embedded connection unit coupled with a bottom chassis and connected to an external stand.

According to an aspect of an exemplary embodiment, a display apparatus includes a chassis, a display panel provided on a first side of the chassis, a connection unit coupled to a second side of the chassis, the connection unit including a bracket link configured to connect to a stand, a rear cover provided on the second side of the chassis, the rear cover including a first through hole through which the bracket link extends to connect to the stand, and wherein the connection unit is configured to perform at least one of tilting and sliding of the chassis with respect to the stand by movement of the bracket link along the first through hole.

The connection unit may include a bracket holder coupled with the bracket link, a bracket plate coupled with the bracket holder through a bracket shaft and a fastener member, the bracket plate including a first edge and a second edge, a stand support holder coupled with the first edge and the second edge, a bracket rail including a guide rail corresponding to a protrusion of the stand support holder, and a bracket support coupled with the bracket rail, and coupled with the chassis.

The bracket holder coupled with the bracket link may be configured to rotate on the bracket shaft with respect to the bracket plate.

The protrusion of the stand support holder may be movably inserted in the guide rail.

The guide rail may have a curvature.

A rotation angle of the bracket holder coupled with the bracket link may depend on a position of the bracket plate with respect to the guide rail.

The fastener member of the bracket plate may include an elastic member, and

A rotation angle of the bracket holder coupled with the bracket link may be limited by the elastic member.

The rear cover further may include at least one sheet configured to cover at least a portion of the first through hole, and a holder sheet configured to fix the at least one sheet to the rear cover.

The at least one sheet may include a plurality of sheets, and a first sheet of the plurality of sheets may include a second through hole through which the bracket link extends.

The at least one sheet may include a plurality of sheets, and a first sheet of the plurality of sheets may be connected to a neighboring sheet of the plurality of sheets through a groove and a hook.

The at least one sheet may include a plurality of sheets, and at least a first sheet of the plurality of sheets may include a protrusion.

The at least one sheet may include a plurality of sheets, wherein a first sheet of the plurality of sheets may be configured to move in correspondence to a movement of the connection unit, and a second sheet of the plurality of sheets may be prevented from moving.

An upper end of a rear surface of the rear cover may have a first curvature, and a center area of the rear surface of the rear cover has a second curvature different from the first curvature.

An upper end of a rear surface of the rear cover may have a first curvature, and a lower end of the rear surface of the rear cover may have a second curvature different from the first curvature.

According to an aspect of another exemplary embodiment, a display apparatus includes a display panel, a chassis configured to accommodate the display panel on a first side of the chassis, a connection unit coupled to a second side the chassis, the connection unit including a bracket link configured to connect to a stand neck of a stand, and a rear cover having at least one curvature and provided on the second side of the chassis, the rear cover including a through hole through which the bracket link extends to connect to the stand neck, wherein the connection unit may be configured to perform at least one of tilting and sliding of the chassis with respect to the stand neck.

According to an aspect of another exemplary embodiment, a display apparatus includes a display panel, a chassis configured to accommodate the display panel on a first side of the chassis, a stand configured to support the chassis, a connection unit coupled to a second side of the chassis and including a bracket link connected to the stand, the connection unit being configured to adjust a display angle of the chassis with respect to the stand, and a rear cover provided on the second side of the chassis, the rear cover including a through hole through which the bracket link extends to connect to the stand, wherein the bracket link is configured to move along the through hole in correspondence to an elevation of the connection unit.

According to an aspect of another exemplary embodiment display apparatus includes a display panel, a chassis configured to support the display panel, a connection unit including a bracket link configured to connect to a stand, wherein the connection unit is configured to slidably and rotatably couple the chassis to the stand, a rear cover configured to cover the chassis, the rear cover including a first through hole through which the bracket link extends to connect to the stand, wherein when the chassis is moved with respect to the stand, the bracket link moves along the first through hole.

The apparatus may further include a first sheet including a second through hole through which the bracket link may be configured to pass, and a second sheet slidably coupled to the first sheet, the first sheet and the second sheet covering a portion of the first through hole, wherein when the bracket link moves along the first through hole, the first sheet slides with respect to the second sheet.

The second sheet may include a groove, and the first sheet may include a hook slidably disposed in the groove.

BRIEF DESCRIPTION OF THE DRAWINGS

The above and/or other aspects will become apparent and more readily appreciated from the following description of exemplary embodiments, taken in conjunction with the accompanying drawings of which.

DETAILED DESCRIPTION

Figure 1A:
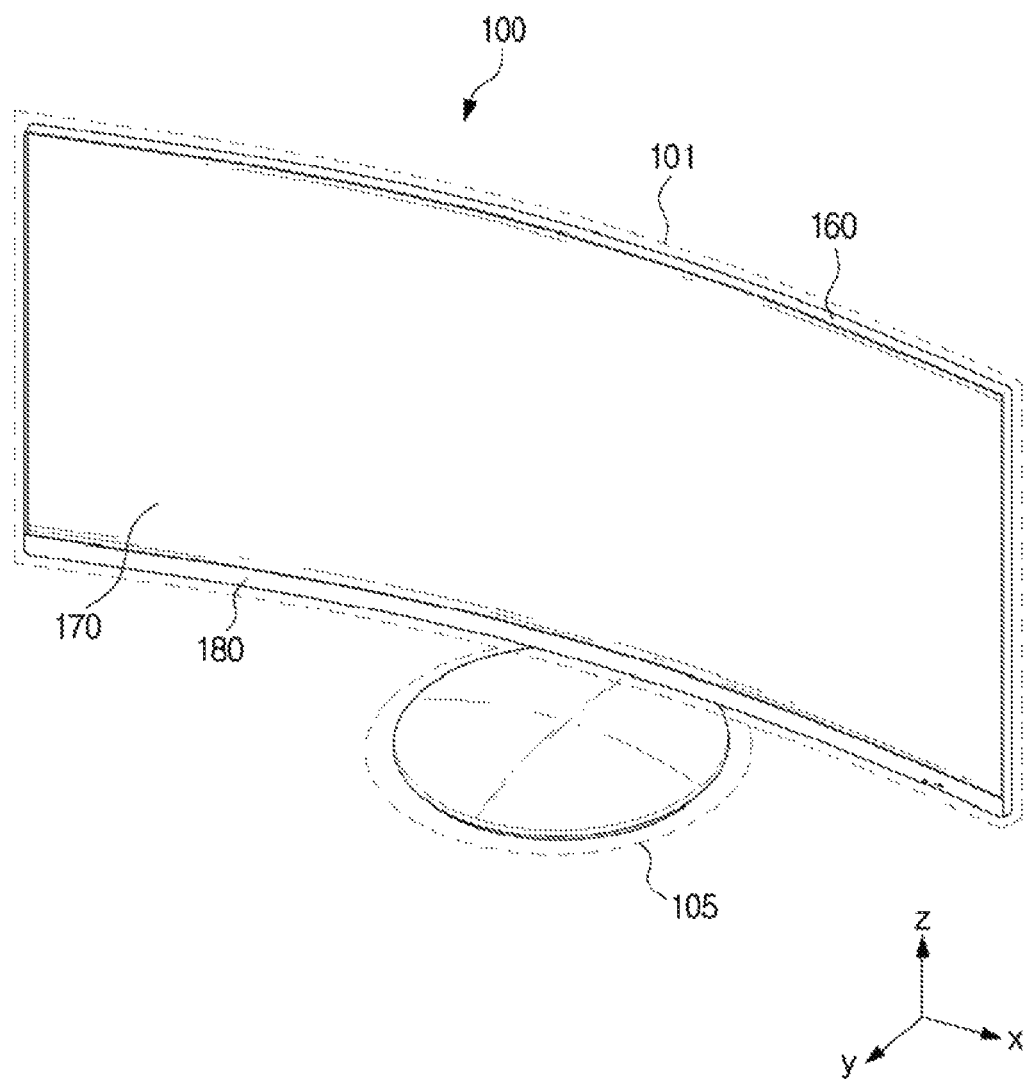
FIG. 1A is a schematic front perspective view of a display apparatus according to an exemplary embodiment.

Hereinafter, exemplary embodiments will be described in detail with reference to the accompanying drawings. Also, a method of manufacturing and using the present disclosure will be described in detail with reference to the accompanying drawings. Also, like reference numerals or symbols denoted in the drawings represent members or components that perform the substantially same functions.

It will be understood that, although the terms first, second, etc. may be used herein to describe various components, these components should not be limited by these terms. These terms are only used to distinguish one component from another. For example, a first component could be termed a second component, and, similarly, a second component could be termed a first component, without departing from the scope of the present disclosure. As used herein, the term "and/or" includes any and all combinations of one or more of associated listed items. Also, expressions such as "at least one of," when preceding a list of elements, modify the entire list of elements and do not modify the individual elements of the list.

Content may be displayed on a display apparatus. For example, the content may include video files or audio files that are reproduced on video player as one of applications, music files that are reproduced on music player, photo files that are displayed on photo gallery, and web page files that are displayed on web browsers. Also, the content may include received broadcast.

In exemplary embodiments, the phrase "curvature is large" means "greatly bent". For example, if a curve (or a curved surface) has a curvature of 1000 R, and another curve (or another curved surface) has a curvature of 4000 R, the curvature of 1000 R of the curve is larger than the curvature of 4000 R of the other curve. That a first curvature is larger than a second curvature means that the first curvature is more greatly bent than the second curvature.

In exemplary embodiments, the display apparatus may include a display apparatus having a flat screen and/or a display apparatus having a curved screen. Also, in exemplary embodiments, the display apparatus may mean a display apparatus including a display unit supported by a stand (or a wall mount).

The terms used in the present disclosure are used to describe exemplary embodiments. Accordingly, it should be apparent to those skilled in the art that the following description of exemplary embodiments is provided for illustration purpose only and not for the purpose of limiting the appended claims and their equivalents. It is to be understood that the singular forms "a," "an," and "the" include plural referents unless the context clearly dictates otherwise. It will be understood that when the terms "includes," "comprises," "including," and/or "comprising," when used in this specification, specify the presence of stated features, figures, steps, components, or combination thereof, but do not preclude the presence or addition of one or more other features, figures, steps, components, members, or combinations thereof.

FIG. 1A is a schematic front perspective view of a display apparatus according to an exemplary embodiment.

Figure 1B:
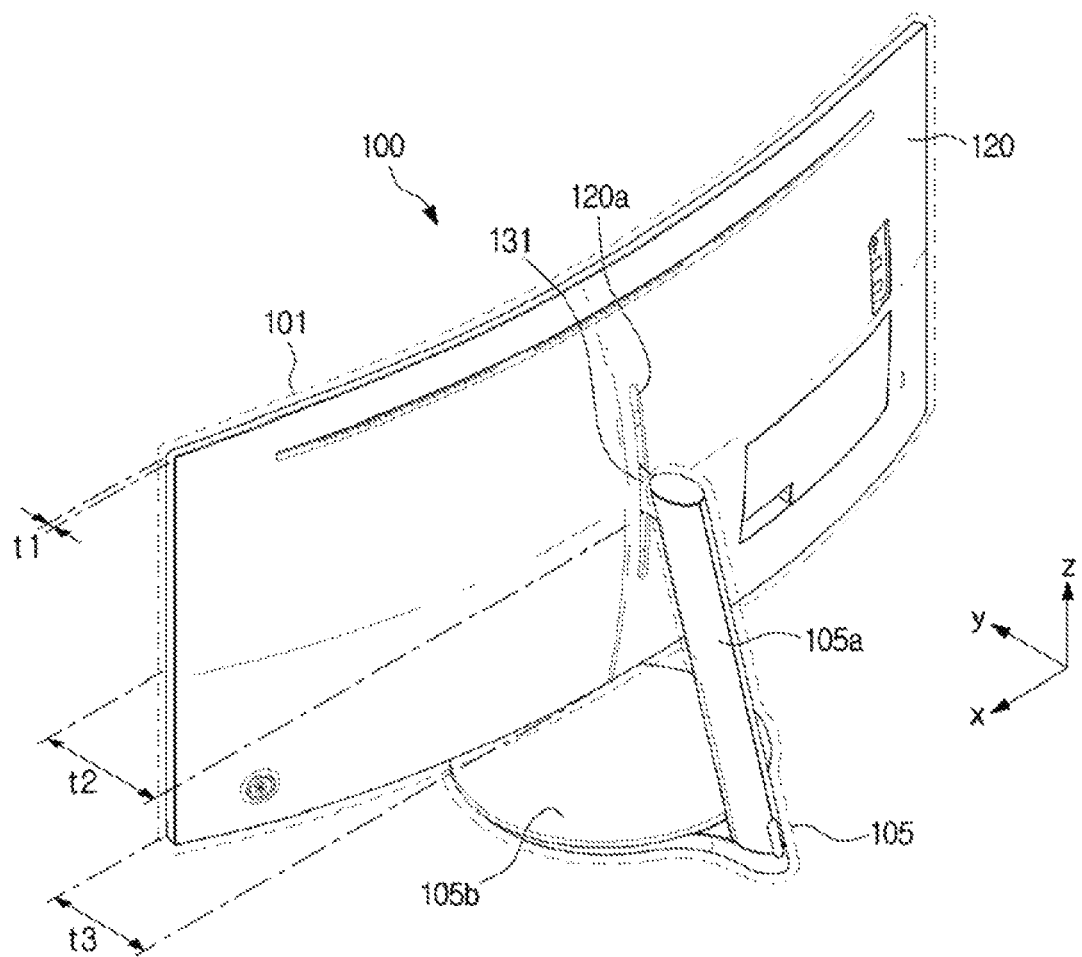
FIG. 1B is a schematic rear perspective view of the display apparatus according to an exemplary embodiment.

FIG. 1B is a schematic rear perspective view of the display apparatus according to an exemplary embodiment.

Referring to FIGS. 1A and 1B, a display apparatus 100 may include a display unit 101, and a stand 105 to support the display unit 101. The stand 105 may include a wall mount to fix (or support) the display unit 101 on a wall.

The display apparatus 100 may include a display panel 170 to display content on the front surface (for example, in a y-axis direction), and a bottom chassis 110 (see FIG. 2) and a top chassis 180 to support the display panel 170. A middle frame 160 may also support the display panel 170. Also, in the display apparatus 100, the display panel 170, the middle frame 160, and the top chassis 180 may be disposed in a front direction (for example, in the y-axis direction) from the bottom chassis 110.

In addition to the above-described components, the display apparatus 100 may further include various components, for example, a light source or a reflecting sheet.

It will be readily understood by those skilled in that art that the sizes and/or shapes of the components included in the display apparatus 100 can change in correspondence to the thickness and/or curvature of the display apparatus 100.

The display apparatus 100 may be an analog TV, a digital TV, a 3D TV, a smart TV, a light emitting diode (LED) TV, an organic light emitting diode (OLED) TV, a plasma TV, a quantum dot TV, a digital signage apparatus (for example, including a single or a plurality of LED display modules arranged in the form of a matrix), and/or a monitor. Also, the display apparatus 100 may be a mobile phone, a smart phone, a MP3 player, a video player, a tablet PC, an electronic blackboard, and/or a wearable device wearable on a body, having a display.

The display apparatus 100 may be implemented as a curved display apparatus having a screen of a constant curvature, a curved display apparatus having a screen of a plurality of curvatures (for example, a first curvature and a second curvature), a flexible display apparatus having a screen of a plurality of curvatures, and/or a curvature-variable display apparatus capable of changing the curvature of the screen according to a received user's input, although is not limited to these.

In an exemplary embodiment, the display apparatus 100 may be a curved display apparatus having a screen ratio of 21:9, or a curved display apparatus having a cinemascope screen ratio of 2.35:1.

Referring to FIG. 1B, a rear cover 120 may be disposed in the rear portion (for example, in the y-axis direction) of the display apparatus 100. The rear cover 120 may have a through hole 120a.

The stand 105 may include a stand neck 105a connected to a bracket link 131 of the display unit 101, and a base 105b connected to the stand neck 105a and placed on a horizontal surface, for example, a desk, furniture, or floor.

The display unit 101 may be tilted, pivoted, and/or swiveled to a certain angle (also referred to as a display angle) with respect to the stand neck 105a. The certain angle may depend on whether the display unit 101 is tilted, pivoted, or swiveled. The display unit 101 may be tilted or pivoted to a certain angle with respect to the stand 105. The angle may depend on whether the display unit 101 is tilted or pivoted. The display unit 101 may be elevated to a certain height with respect to the base 105b.

The stand neck 105a may be in the shape of a cylinder, according to an exemplary embodiment. For example, the stand neck 105a may be in the shape of a cylinder having an oval section. According to another example, the stand neck 105a may be in the shape of a cylinder having a triangular or polygonal section. According to another example, the stand neck 105a may be in the shape of a cylinder having a polygon section with rounded edges. According to another example, the stand neck 105a may be in the shape of a tapered cylinder.

The base 105b may be in the shape of a circle or an oval, according to an exemplary embodiment. However, the base 105b may be in the shape of a triangle, a polygon, a plurality of bars arranged at a certain angle (for example, below 180 degrees), a tripod, or a quadruped structure. One end of the stand neck 105a may be connected (or fixed) to the inside or outside of the base 105b. However, the above-mentioned shapes of the base 105b may be examples, and the shape of the base 105b is not limited to these.

The stand neck 105a and the base 105b may be implemented as separate bodies, or integrated into one body. Also, the bracket link 131 and the stand neck 105a may be integrated into one body.

If the display apparatus 100 is fixed to a wall, the bracket link 131 may be coupled with a wall mount to support the display apparatus 100. If the bracket link 131 is coupled with the wall mount, a connection unit 130 (see FIG. 2) of the display apparatus 100 (or the display unit 101) may operate (for example, tilt or slide) with respect to the wall mount.

When the bracket link 131 is coupled with the wall mount, the wall mount may not require a separate device (for example, a link) for operating (for example, tilting or sliding). Also, when the bracket link 131 is coupled with the wall mount, the wall mount may not require a separate device for operating (for example, pivoting or swiveling).

A power terminal may be exposed from the rear cover 120 of the display apparatus 100, and may be connected to a power cable.

The thickness of the display apparatus 100 may be the thickness of the display unit 101 excluding the stand 105. The thickness of the display apparatus 100 may be a uniform one of the thicknesses t1, t2, and t3 of the display unit 101, or a non-uniform one of the thicknesses t1, t2, and t3 of the display unit 101. The thickness t2 of the display unit 101 at a location of the through hole 120a of the rear cover 120 may be thicker than the thickness t1 of the display unit 101 at a location of the upper-end edge of the rear cover 120. Also, the thickness t3 of the display unit 101 at a location of the lower-end edge of the rear cover 120 may be thicker than the thickness t1 of the display unit 101 at a location of the upper-end edge of the rear cover 120. Also, the thickness t2 of the display unit 101 at a location of the through hole 120a of the rear cover 120 may be equal to or different from the thickness t3 of the display unit 101 at a location of the lower-end edge of the rear cover 120.

The thickness t1 of the upper ends of the bottom chassis 110 and the top chassis 180 without the stand 105 may be, for example, 10 mm or less. The thickness t1 of the display apparatus 100 may be, for example, 12 mm or less. Also, the thickness t1 of the display apparatus 100 may be, for example, greater than 4.0 mm and smaller than 11.0 mm. Also, the thickness t1 of the display apparatus 100 may be, for example, greater than 5.0 mm and smaller than 15.0 mm.

The thickness t2 of the center areas (for example, the center area of the through hole 120a) of the bottom chassis 110 and the top chassis 180 without the stand 105 may be, for example, 112 mm or less. The thickness t2 of the display apparatus 100 may be, for example, 115 mm or less. The thickness t2 of the display apparatus 100 may be, for example, greater than 40 mm and smaller than 120 mm. Also, the thickness t2 of the display apparatus 100 may be, for example, greater than 70 mm and smaller than 130 mm.

The thickness t3 of the lower ends of the bottom chassis 110 and the top chassis 180 without the stand 105 may be, for example, 94 mm or less. The thickness t3 of the display apparatus 100 may be, for example, 98 mm or less. The thickness t3 of the display apparatus 100 may be, for example, greater than 35 mm and smaller than 100 mm. The thickness t3 of the display apparatus 100 may be, for example, greater than 60 mm and smaller than 110 mm.

If the display apparatus 100 is a curved display apparatus, the display apparatus 100 may have a curvature. For example, the curvature of the display apparatus 100 may be 3200 R. Also, the curvature of the display apparatus 100 may be, for example, greater than 1800 R and smaller than 3000 R.

The curvature of the rear cover 120 may be equal to or different from the curvature of the display panel 170. The curvature of the rear cover 120 may be equal to or different from the curvature of the display panel 170 by the connection unit 130 (see FIG. 2) coupled with the bottom chassis 110. For example, the curvature of the upper-end edge of the rear cover 120 may be different from the curvature of the through hole 120a of the rear cover 120. Also, the curvature of the upper-end edge of the rear cover 120 may be different from that of the lower-end edge of the rear cover 120.

In the case that the display apparatus 100 is a curved display apparatus, the curvature of the rear surface (or the rear cover 120) of the display apparatus 100 may be different from that of the display panel 170. For example, the curvature of the display panel 170 may be smaller than or equal to that of the rear surface of the display apparatus 100. For example, the curvature of the display panel 170 may be 3000 R, and the curvature of the rear surface of the display apparatus 100 may be 2000 R.

The curvature of the upper-end area of the rear surface (for example, in the y-axis direction) of the rear cover 120 may be 2700 R. The curvature of the center area of the rear cover 120 may be 1800 R. Also, the curvature of the lower-end area of the rear cover 120 may be 2400 R. In the present exemplary embodiment, the differences in curvature between the upper-end area, the center area, and the lower-end area of the rear cover 120 may be caused by the connection unit 130 (see FIG. 2) connected to the rear surface of the bottom chassis 110. Also, in the present exemplary embodiment, the differences in curvature between the upper-end area, the center area, and the lower-end area of the rear surface of the rear cover 120 may be caused by first operation and/or second operation of the connection unit 130 (see FIG. 2) connected to the rear surface of the bottom chassis 110.

In an exemplary embodiment, according to the Video Electronics Standards Association (VESA) standard, a plurality of VESA holes (or referred to as VESA mount holes) may be not formed in the rear surface (or the rear surface of the rear cover 120) of the display apparatus 100. If the display apparatus 100 is fixed on a wall, the bracket link 131 may be coupled with a wall mount by a fastener member (for example, a screw, a rivet, etc.).

However, in another exemplary embodiment, a plurality of VESA holes (or referred to as VESA mount holes) according to the VESA standard may be formed in the rear surface (or the rear surface of the rear cover 120) of the display apparatus 100.

In an exemplary embodiment, the display unit 101 connected to the stand 105 may be tilted and/or elevated by an interaction of the stand 105 with the connection unit 130, located in the inside of the display unit 101. The display unit 101 may be tilted and elevated by the structure and/or operation of the connection unit 130 connected to the fixed stand 105. Also, the display unit 101 connected to the stand 105 may be pivoted and/or swiveled by interaction of the connection unit 130 located in the inside of the display unit 101 with the stand 105.

Figure 2:
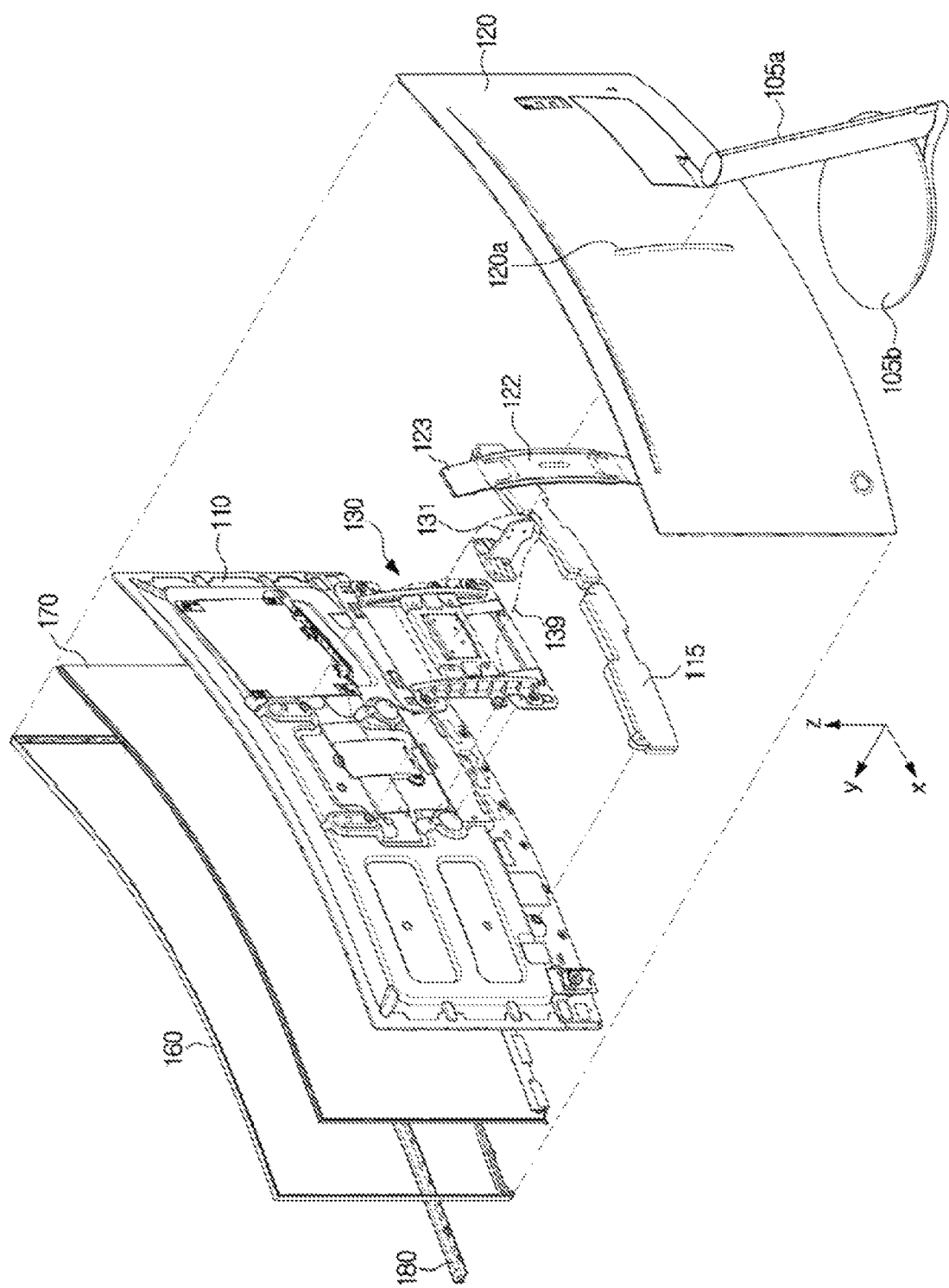
FIG. 2 is a schematic exploded perspective view of a curved display apparatus according to an exemplary embodiment.

FIG. 2 is a schematic exploded perspective view of a curved display apparatus according to an exemplary embodiment.

Figure 3:
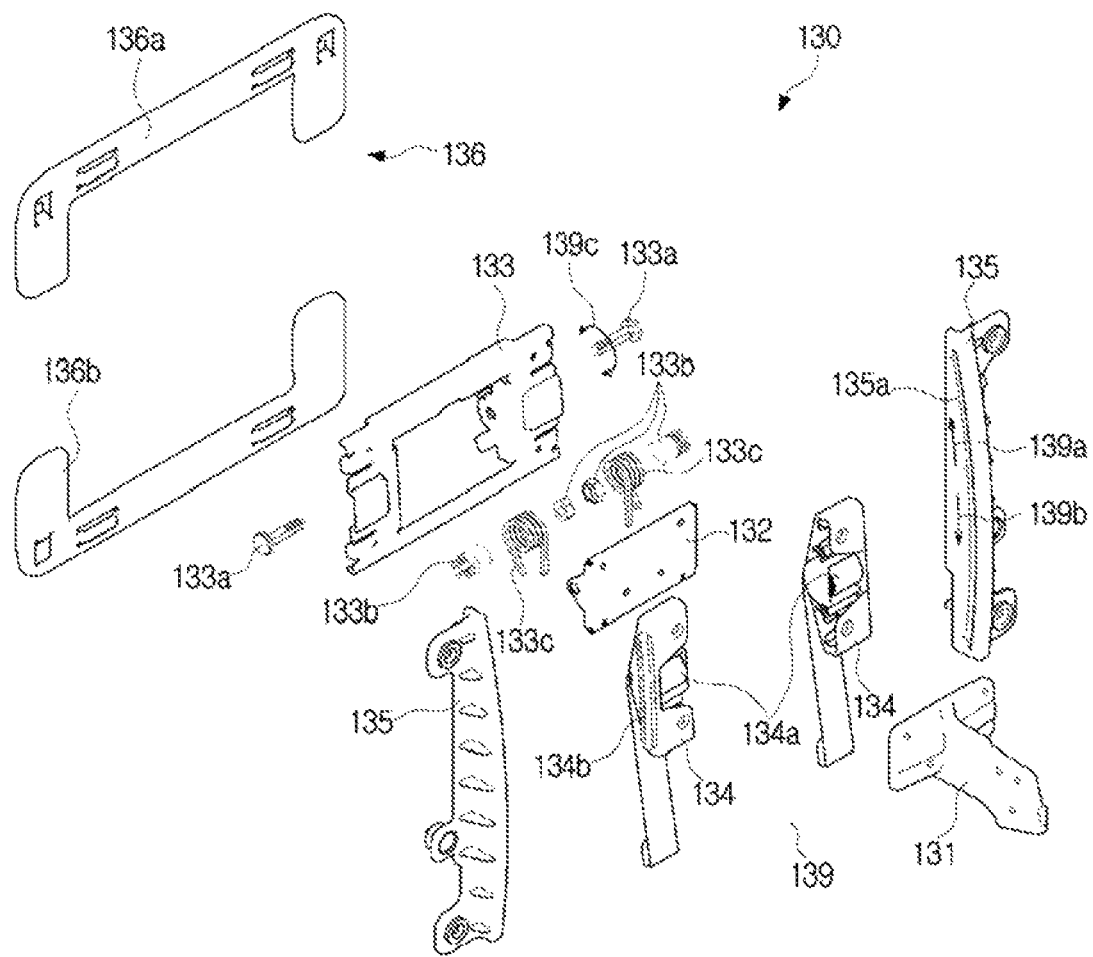
FIG. 3 is a schematic exploded perspective view of a sliding assembly of the curved display apparatus according to an exemplary embodiment.

FIG. 3 is a schematic exploded perspective view of a sliding assembly of the curved display apparatus according to an exemplary embodiment.

Referring to FIGS. 2 and 3, the display apparatus 100 may include the bottom chassis 110, the connection unit 130, the display panel 170, the middle frame 160, the top chassis 180, and the stand 105. The display apparatus 100 may further include the bracket link 131 and a sheet 122 (which may be a polyethylene terephthalate (PET) sheet). Also, the display apparatus 100 may further include a speaker unit 115.

In the display apparatus 100, at least one component of the bottom chassis 110, the display panel 170, the middle frame 160, and the top chassis 180 may have a curvature corresponding to the curvature of the display apparatus 100. Also, in the display apparatus 100, the connection unit 130 may have a curvature corresponding to the curvature of the display apparatus 100.

On the front surface (for example, in the y-axis direction) of the bottom chassis 110, a light source and other components (for example, the display panel 170, the middle frame 160, the top chassis 180, etc.) may be accommodated. Also, on the front surface of the bottom chassis 110, at least one of a reflecting sheet, a diffusion plate, and an optical sheet may be further accommodated.

On the rear surface (for example, in the y-axis direction) of the bottom chassis 110, a Printed Circuit Board (PCB) and the connection unit 130 may be accommodated.

The bottom chassis 110 may be formed in the shape of a polygonal plate having high strength, and the bottom chassis 110 may be formed of a metal material (for example, aluminum or an aluminum alloy) having low thermal deformation against heat emitted from the light source and/or the display panel 170.

The bottom chassis 110 may be formed of a light metal having a specific gravity of, for example, 4 or less, and may be formed of, for example, magnesium, beryllium, titanium, an alkali metal, or an alkali earth metal. The bottom chassis 110 may be formed of a nonferrous metal except for iron and iron-based alloys. The bottom chassis 110 may be molded with a plastic material (for example, Poly Carbonate (PC)). Also, the bottom chassis 110 may be molded by adding a glass fiber to a plastic material.

The light source may be accommodated on the front surface of the bottom chassis 110, and may emit light by receiving power supplied from the outside. The light source may emit light toward the display panel 170 located in the front direction (for example, the y-axis direction), and may function as a backlight in the display apparatus 100. The light source may include LEDs. Also, the light source may be a cold cathode fluorescent lamp (CCFL). The light source may include a lens The light source may include a plurality of LED bars each configured with a plurality of LEDs. The LED bars may be arranged in parallel to each other at predetermined intervals on the front surface of the bottom chassis 110 (for example, direct type). Also, a plurality of LED bars may be arranged in pair at both edges of the bottom chassis 110 (for example, edge type).

Also, the plurality of LED bars may be arranged at the upper and lower edges of the bottom chassis 110 or at the left and right edges of the bottom chassis 110. Also, the plurality of LED bars may be arranged at all of the edges of the bottom chassis 110, for example, at the upper, lower, left, and right edges of the bottom chassis 110. The plurality of LED bars may be electrically connected to each other.

If the LED bar is located in at least one edge of the bottom chassis 110, a light guide plate may be disposed to guide light irradiated from the light source uniformly to the display panel 170. The light guide plate may be formed of a transparent plastic material.

If the display panel 170 of the display apparatus 100 is an OLED panel, the light source may be omitted.

The middle frame 160 may be located on the front surface (for example, in the y-axis direction) of the display panel 170, and support the display panel 170.

The middle frame 160 may be formed of an acrylonitrile-butadiene-styrene (ABS) resin and/or a glass fiber. Also, the middle frame 160 may be formed of various plastic materials, resins, and/or metal materials.

The display panel 170 may be a thin film transistor-liquid crystal display (TFT-LCD). Also, the display panel 170 may be a thin film transistor-active matrix organic light emitting diodes (TFT-AMOLED) display. Also, the display panel 170 may be a thin film transistor-organic light emitting diodes (TFT-OLED) display. However, the display panel 170 is not limited to the above-mentioned examples.

The display panel 170 may include a polarizing plate and/or a color filter.

In the lower end (or one of the upper end, the left edge, and the right edge of the display panel 170) of the display panel 170, a PCB may be disposed to generate driving signals for driving the display panel 170.

The display panel 170 may be electrically connected to the PCB through a chip on film. The chip on film may electrically connect the display panel 170 located on the front surface of the bottom chassis 110 to the PCB located on the rear surface of the bottom chassis 110.

Also, the display panel 170, the chip on film, and the PCB may be connected to each other in the direction of gravity (for example, a z-axis direction). Also, the middle frame 160 may be disposed in front of the display panel 170.

The top chassis 180 may be coupled with the bottom chassis 110 that accommodates the components 120 through 170 of the display unit 101 therein. The top chassis 180 may be disposed on the front surface of the display apparatus 100, to protect the components 120 through 170 from external shock, and/or to prevent light emitted from the light source from leaking out (for example, light loss).

The top chassis 180 may be disposed along the circumference of the display panel 170. The top chassis 180 may be disposed on only one edge (for example, one of the upper, lower, left, and right edges of the display panel 170) of the display panel 170. Also, the top chassis 180 may be not provided in the display apparatus 100. If the top chassis 180 is not provided in the display apparatus 100, the display panel 170 may be adhered on the middle frame 160 of the display apparatus 100 by a film, a tape, an adhesive, or a transparent synthetic resin.

The top chassis 180 may have a predetermined shape (for example, a "¬"-shaped structure) capable of covering the lower end of the display panel 170.

The connection unit 130 may be fixed on the rear surface of the bottom chassis 110. The connection unit 130 may be coupled with the rear surface of the bottom chassis 110 by a fastener member (for example, a screw, a rivet, or a hook). Also, the connection unit 130 may be fixed on the rear surface of the bottom chassis 110 by welding (for example, welding, press welding, or soldering).

The connection unit 130 may include the bracket link 131, a bracket holder 132, a bracket plate 133, a stand supporter holder 134, a bracket rail 135, and a bracket support 136. The connection unit 130 may be divided into a plurality of components corresponding to a plurality of operations. Also, the connection unit 130 may be divided into a plurality of operation structures corresponding to a plurality of operations.

For example, in the case of tilting operation of the display unit 101, the bracket link 131, the bracket holder 132, the bracket plate 133, and additional members (for example, a bracket shaft 133*a*, a fastener member 133*b*, and an elastic member 133*c*) of the connection unit 130 may be components corresponding to the tilting operation. An assembly of the components corresponding to the tilting operation may be referred to as a first operation structure.

In the case of sliding operation of the display unit 101, the bracket plate 133, the stand supporter holder 134, the bracket rail 135, and the bracket support 136 may be components corresponding to the sliding operation. An assembly of the components corresponding to the sliding operation may be referred to as a second operation structure.

In the connection unit 130, a coupled structure of the bracket link 131, the bracket holder 132, the bracket plate 133, the stand support holder 134, and the corresponding fastener members may be referred to as a moving unit 139.

The moving unit 139 may perform a single or a plurality of operations. For example, the moving unit 139 may enable the display unit 101 to tilt and/or slide. The operations of the moving unit 139 are described below.

The bracket link 131 may be coupled with one end of the stand neck 105*a* of the stand 105 by a fastener member (for example, a screw or a rivet).

The bracket holder 132 may be coupled with the bracket link 131 by a fastener member (for example, a screw or a rivet).

The bracket link 131 and the bracket holder 132 coupled with the bracket link 131 may be coupled with the bracket plate 133.

The bracket plate 133 may be coupled with the bracket link 131 and the bracket holder 132 by a bracket shaft 133*a* and a fastener member 133*b* (for example, a washer, a bush, etc.). Also, an elastic member 133*c* (for example, a torsion spring) may be coupled with the outer circumferences of the bracket shaft 133*a* and the fastener member 133*b*.

The bracket link 131 and the bracket holder 132 coupled by the bracket shaft 133*a* and the fastener member 133*b* may rotate (for example, tilt in an arrow direction 139*c*) to a certain angle (for example, an angle of 6 degrees forward with respect to the z-axis or an angle of −6 degrees backward with respect to the z-axis) with respect to the bracket plate 133.

The display unit 101 may be tilted by the bracket link 131 and the bracket holder 132 coupled by the bracket shaft 133*a* and the fastener member 133*b* in the moving unit 139. The tilting of the display unit 101 may be referred to as a first operation of the moving unit 139.

The certain angle may be an example, and may change according to the coupling structure of the bracket link 131 and the bracket holder 132 coupled by the bracket shaft 133a and the fastener member 133b, for example, in the range of ±1 degree to ±12 degrees.

The rotation of the bracket link 131 and the bracket holder 132 with respect to the bracket plate 133 may be limited by the elastic member 133c. The elastic member 133c may provide an elastic force to the rotation of the bracket link 131 and the bracket holder 132.

A pair of stand support holders 134 may be coupled with both edges of the bracket plate 133 with which the bracket link 131 and the bracket holder 132 are coupled, by a fastener member (for example, a screw, a rivet, etc.). In the inside of each stand support holder 134, an elastic member 134a (for example, a plate spring) may be inserted.

A protrusion 134b of each stand support holder 134 may face a guide rail 135a. The protrusion 134b may have a predetermined thickness that is thinner than that of the stand support holder 134.

A bracket rail 135 including the guide rail 135a for guiding movement of each stand support holder 134 coupled with the bracket plate 133 may be coupled with the stand support holder 134. The bracket plate 133 may move (for example, sliding or sliding including tilting, in an upward direction 139a and an downward direction 139b) by the protrusion 134b of the stand support holder 134 inserted in the guide rail 135a of the bracket rail 135.

The bracket plate 133 may move to a predetermined distance (for example, 105 mm although the distance depends on the structure of the bracket rail 135) that is shorter than the length (for example, 175 mm although the length depends on the structure of the bracket rail 135) of the guide rail 135a. The length of the guide rail 135a may be different from a sum of the height (for example, in the z-axis direction) of the bracket plate 133 and the movable distance of the bracket plate 133. The length of the guide rail 135a may be equal to or shorter than a sum of the height (for example, in the z-axis direction) of the bracket plate 133 and the movable distance of the bracket plate 133.

Because the guide rail 135a has a predetermined curvature, a movement trajectory of the bracket plate 133 with respect to the base 105b may be in the shape of a curve (for example, a shape ")"). Also, a movement trajectory of the bracket plate 133 may be not a straight line (for example, a shape "|"). However, the guide rail 135a of the bracket rail 135 having the predetermined curvature may be an example, and in an exemplary embodiment, the bracket rail 135 and the guide rail 135a may be in the shape of a straight line without having a curvature.

The display unit 101 may move (for example, slide) by movement of each stand support holder 134 coupled with the bracket link 131 and the bracket plate 133 coupled by the bracket shaft 133a and the fastener member 133b in the moving unit 139. This movement of the display unit 101 may be referred to as second operation of the moving unit 139. However, the above-described operation of the moving unit 139 may be an example, and it will be easily understood by those skilled in the art that a third operation (for example, pivot) or a fourth operation (for example, swivel) is possible by an additional component (for example, a component corresponding to rotation).

Each bracket rail 135 may be coupled with the bracket support 136 by a fastener member (for example, a screw, a rivet, etc.). Also, one end of each elastic member 134a located in the inside of each stand support holder 134 may be coupled with the bracket support 136 (for example, a lower-end bracket support 136b or an upper-end bracket support 136a).

The connection unit 130 of the bottom chassis 110 may be coupled with the stand 105 through the through hole 120a of the rear cover 120. The main portion (for example, except for the bracket link 131) of the through hole 120a of the rear cover 120 may be covered by the sheet 122 and the holder sheet 123. The inside of the display unit 101 may be not exposed due to the sheet 122 and the holder sheet 123 covering the through hole 120a of the rear cover 120.

The holder sheet 123 may fix the sheet 122 on the rear surface 120-1 of the rear cover 120. The area of the holder sheet 123 may be different from that of the sheet 122. Also, the area of the holder sheer 123 may be wider than that of the through hole 120a.

The sheet 122 and the holder sheet 123 are described in more detail with reference to FIGS. 4A to 6B, below.

The bracket link 131 of the connection unit 130 coupled with the bottom chassis 110 may be exposed through the through hole 120a of the rear cover 120 to be coupled with one end of the stand neck 105a of the stand 105. One end of the bracket link 131 in the connection unit 130 may pass through the through hole 120a of the rear cover 120 to be exposed and coupled with one end of the stand neck 105a of the stand 105. The bracket link 131 of the connection unit 130 and the stand neck 105a of the stand 105 may be coupled by a fastener member.

Some of the above-described components 131 to 136 of the connection unit 130 may be integrated into one body.

In the connection structure of the connection unit 130, the bracket link 131, and the stand neck 105a, the stand 105 may support the display unit 101. Operation (for example, tilting or sliding) of the display unit 101 may be performed by the connection unit 130 which may be a component of the display unit 101. Also, operation (for example, tilting or sliding) of the display unit 101 may be performed by the moving unit 139 which may be one of the components of the display unit 101. Also, operation (for example, pivoting or swiveling) of the display unit 101 may be performed by the connection unit 130 which may be one of the components of the display unit 101.

Figure 4A:
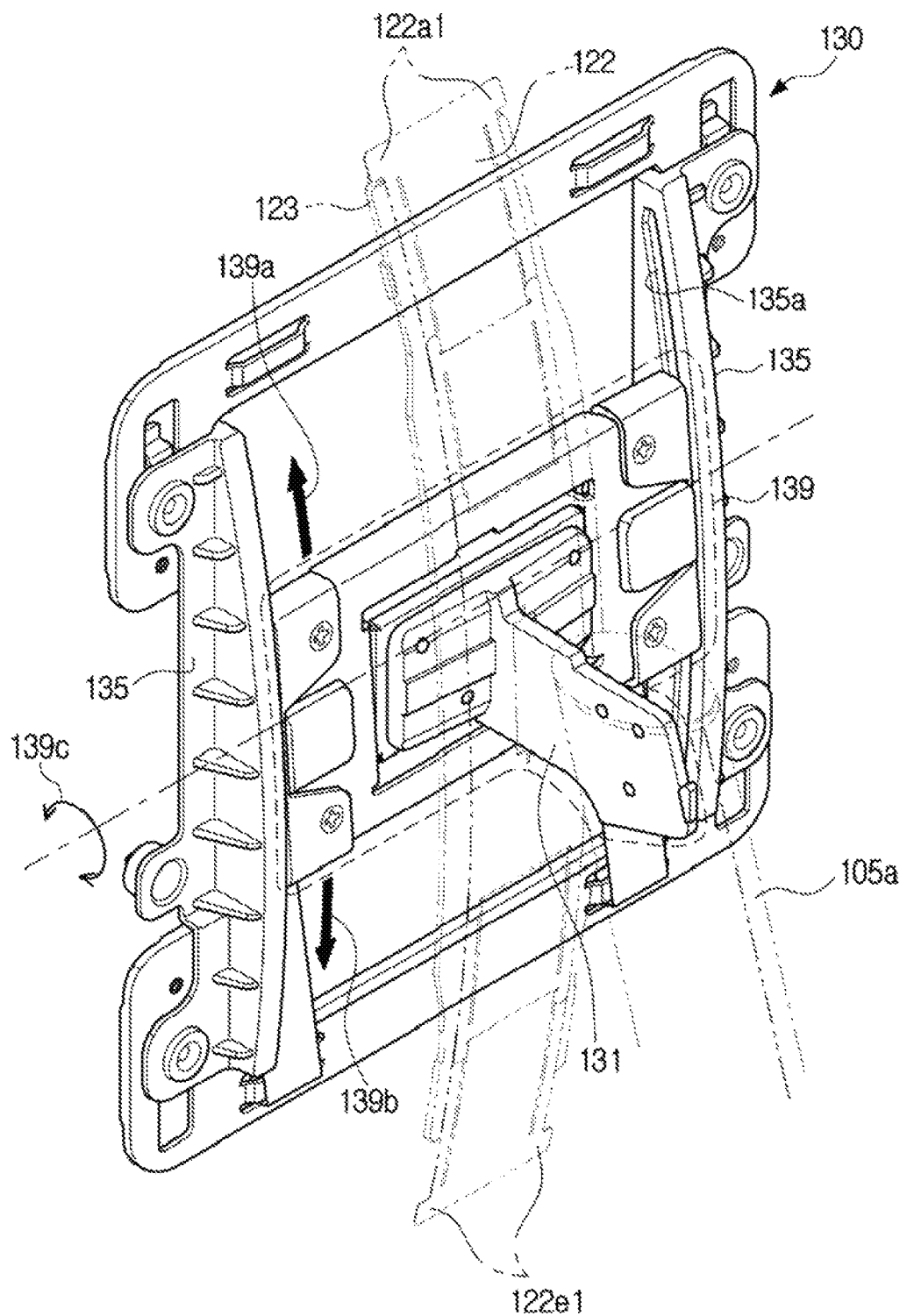
FIG. 4A is a schematic perspective view showing a connection of a stand and a connection unit of the display apparatus in the center area of a rear cover through hole according to an exemplary embodiment.

FIG. 4A is a schematic perspective view showing a connection of a stand and a connection unit of the display apparatus in the center area of a rear cover through hole according to an exemplary embodiment.

Figure 4B:
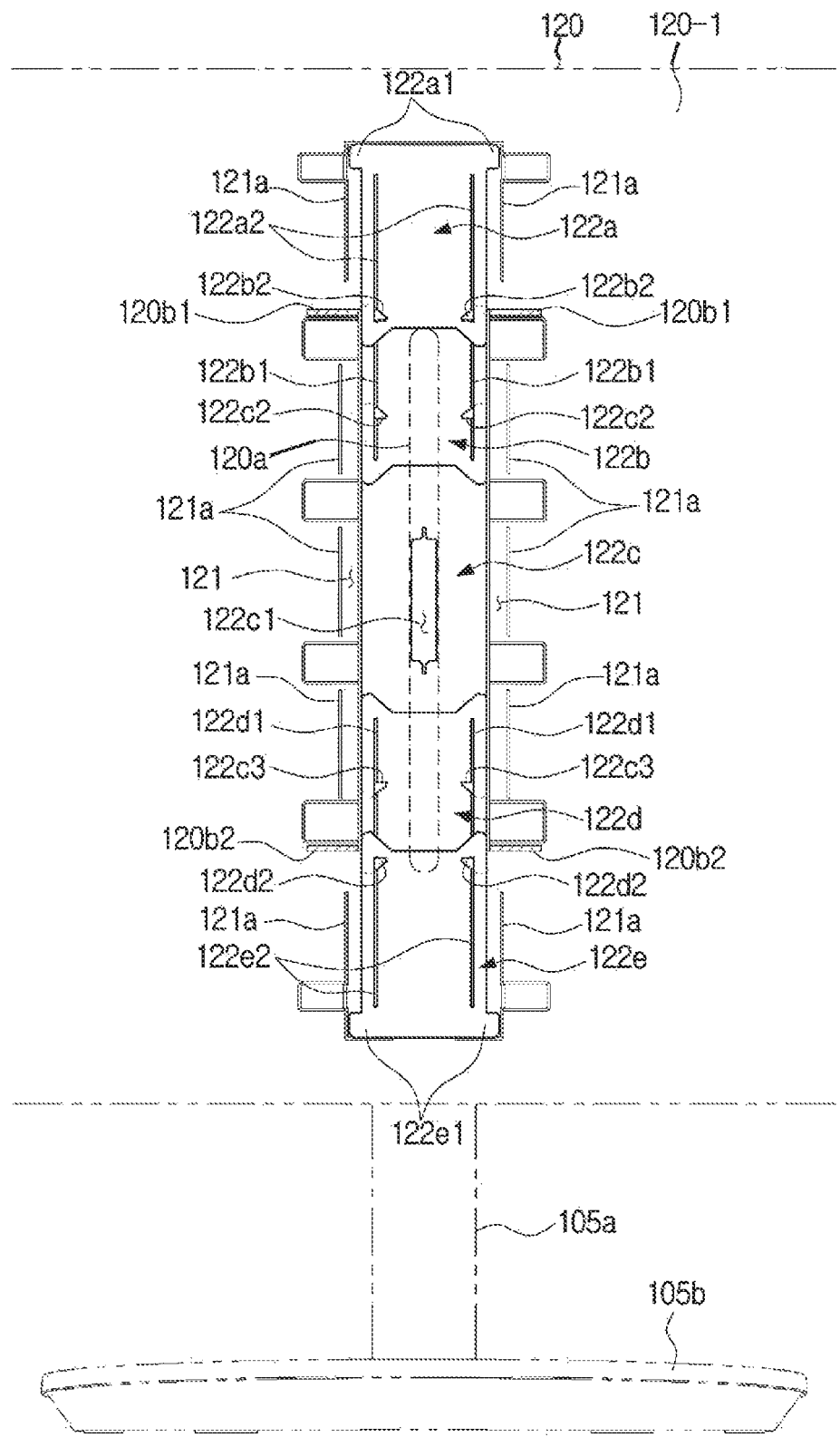
FIG. 4B is a schematic plan view showing a rear cover and a sheet corresponding to the connection of the stand and the connection unit of the display apparatus in the center area of the rear cover through hole according to an exemplary embodiment.

FIG. 4B is a schematic plan view showing a rear cover and a sheet corresponding to the connection of the stand and the connection unit of the display apparatus in the center area of the rear cover through hole according to an exemplary embodiment.

Referring to FIGS. 4A and 4B, the display unit 101 and the stand 105 are shown connected to each other in the center area of the through hole 120a of the rear cover 120. More specifically, the display unit 101 may be coupled with the stand 105 in the center area of the guide rail 135a of the bracket rail 135.

In the connection unit 130 fixed on the rear surface of the bottom chassis 110, the moving unit 139 may move upward (for example, a direction away from the base 105b) or downward (for example, a direction toward the base 105b) along the guide rail 135a of the bracket rail 135. More specifically, the moving unit 139 may move upward (for example, a direction away from the base 105b) or downward (for example, a direction toward the base 105b) for a distance that is shorter than the length of the guide rail 135a of the bracket rail 135.

The moving unit 139 may move smoothly in an upward direction 139a or a downward direction 139b along the guide rail 135a of the bracket rail 135 by an external force applied from the outside. Also, the moving unit 139 may move in an upward direction 139a or a downward direction 139b along the guide rail 135a of the bracket rail 135, at speed corresponding to the intensity of an external force applied from the outside.

The bracket link 131 of the moving unit 139 may be exposed to the outside through the through hole 120a of the rear cover 120. The sheet 122, or the coupling portions of the sheet 122 and the holder sheet 123 may cover, except for an area of the through hole 120a through which the bracket link 131 passes, the remaining area of the through hole 120a, and may thereby prevent foreign substances such as dust from entering the inside of the display unit 101.

If the sheet 122 or the coupling portions of the sheet 122 and the holder sheet 123 are not provided, foreign substances may enter the inside of the display unit 101 through the remaining area of the through hole 120a except for the area of the through hole 120a through which the bracket link 131 passes.

An accommodating area 121 for accommodating the sheet 122 therein may be formed in the rear surface 120-1 of the rear cover 120. The accommodating area 121 may have an appropriate depth (or a concave surface) so that it can accommodate the sheet 122 therein. The accommodating area 121 may have a plurality of partitions (for example, having a height of 3 mm or more although the height can change) 121a corresponding to the thickness (for example, 2 mm or less although the thickness can change) of the sheet 122. Also, the accommodating area 121 may have a depth (or a concave surface) corresponding to the thickness (for example, 2 mm or less although the thickness can change) of the sheet 122.

In the accommodating area 121, the intervals between the partitions 121a may be different from each other. For example, the interval between the partitions 121a corresponding to a first sheet 122a may be wider than that between the partitions 121a corresponding to a second sheet 122b. Also, the interval between the partitions 121a corresponding to the first sheet 122a may be wider than that between the partitions 121a corresponding to a third sheet 122c and/or that between the partitions 121a corresponding to a fourth sheet 122d. Also, the interval between the partitions 121a corresponding to the first sheet 122a may be equal to or different from that between the partitions 121a corresponding to a fifth sheet 122e.

The sheet 122 may move in the accommodating area 121.

In the rear surface 120-1 of the rear cover 120, a plurality of protrusions 120b1 and protrusions 120b2 may be located adjacent to the accommodating area 121 and protrude (for example, the protrusions 120b1 and 120b2 are thicker than the thickness of the sheet 122). The protrusions 120b1 and 120b2 may be respectively positioned at both sides of the sheet 122. The protrusions 120b1 and 120b2 may be respectively positioned at both sides of the first sheet 122a and at both sides of the fifth sheet 122e.

The sheet 122 may be a plurality of sheets 122a through 122e. The sheets 122a through 122e may be connected to the neighboring sheets 122a to 122e through a plurality of grooves 122a2, 122b1, 122d1, and 122e2 and/or a plurality of hooks 122b2, 122c2, 122c3, and 122d2.

The sheets 122a through 122e may be formed of plastic, paper, or a resin. However, the sheets 122a through 122e may be formed of any other material (that is, a material that is not broken or torn easily) capable of moving in correspondence to the movement of the bracket link 131.

Sheet 122a may have a protrusion 122a1 at one end, and similarly sheet 122e may have protrusion 122e1 at one end. The movement (for example, movement in the z-axis direction) of the first sheet 122a may be limited by the protrusion 120b1. For example, the movement of the first sheet 122a may be limited by contact of the protrusion 122a1 of the first sheet 122a to the protrusion 120b1.

The movement (for example, movement in the z-axis direction) of the fifth sheet 122e may be limited by the protrusion 120b2. For example, the movement of the fifth sheet 122e may be limited by contact of the protrusion 122e1 of the fifth sheet 122e to the protrusion 120b2.

The sheets 122a through 122e may include a sheet (for example, the third sheet 122c) having none of the grooves 122a2, 122b1, 122d1, and 122e2, or a sheet (for example, the sheets 122a and 122e) having none of the hooks 122b2, 122c2, 122c3, and 122d2. Also, the sheets 122a through 122e may include the third sheet 122c having a through hole 122c1 through which the bracket link 131 passes.

At least one sheet of the sheets 122a through 122e may move in correspondence to the movement of the display unit 101 (or, the second operation of the moving unit 139). More specifically, the hook of at least one sheet of the sheets 122a through 122e may move in correspondence to the movement of the display unit 101 (or, the second operation of the moving unit 139), along the groove of another neighboring sheet.

The display unit 101 connected to the stand 105 in the center area of the guide rail 135a of the bracket rail 135 may perform the first operation (for example, tilting) in an arrow direction 139c to a certain angle (or a display angle, for example, an angle of 6 degrees forward with respect to the z-axis or an angle of −6 degrees backward with respect to the z-axis) in an arrow direction 139c with respect to the bracket shaft 133a as a reference axis. Also, the display unit 101 connected to the stand 105 in the center area of the guide rail 135a of the bracket rail 135 may perform the first operation (for example, tilting) and the second operation (for example, sliding) to a certain angle (or a display angle, for example, an angle of 28 degrees forward with respect to the z-axis or an angle of −8 degrees backward with respect to the z-axis). Also, the display unit 101 connected to the stand 105 in the upper-end area of the guide rail 135a of the bracket rail 135 may perform the first operation (for example, tilting) and the second operation (for example, sliding) to a certain angle (or a display angle, for example, an angle of 32 degrees forward with respect to the z-axis or an angle of −7 degrees backward with respect to the z-axis).

However, these angles are examples, and the angles may change.

Figure 5A:
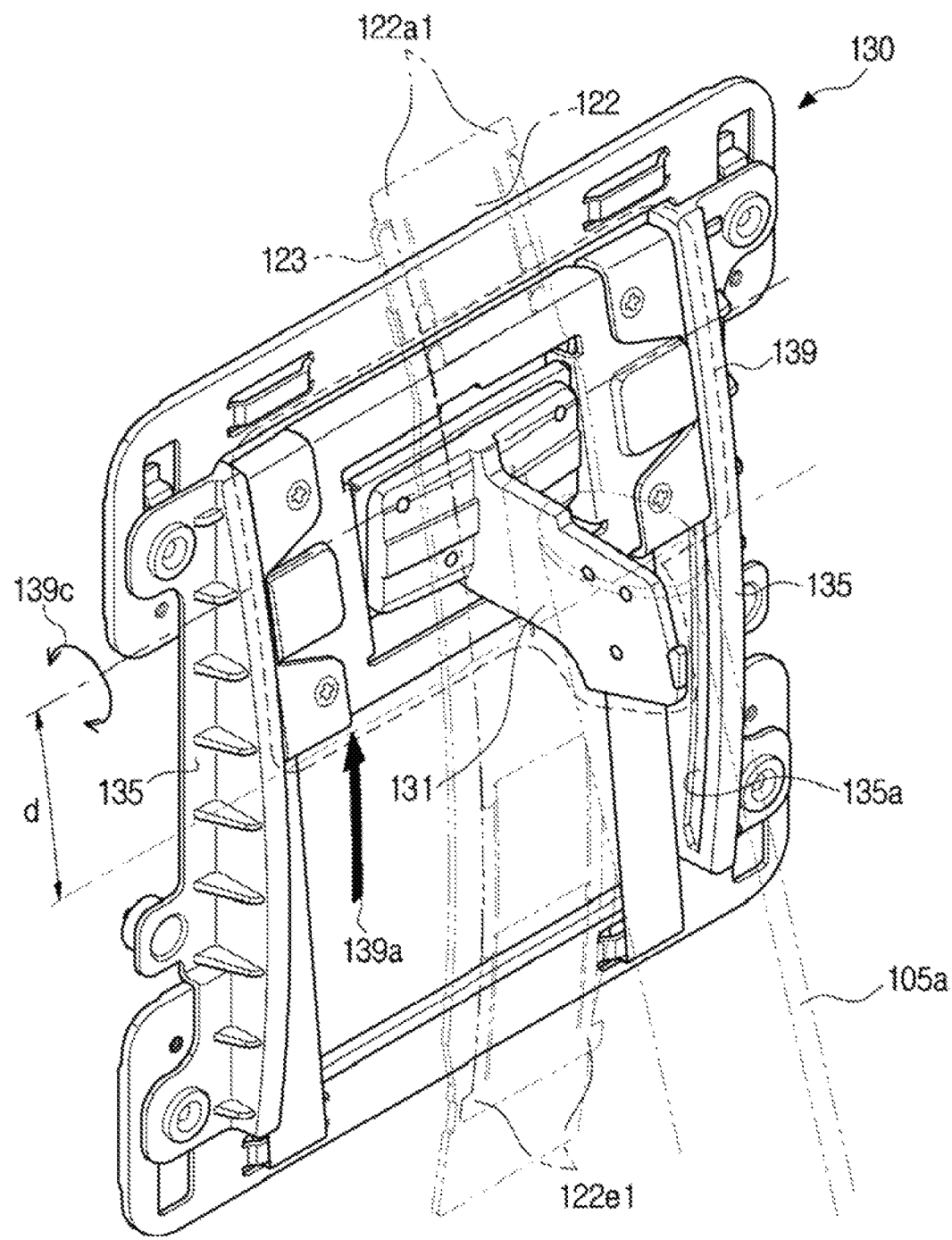
FIG. 5A is a schematic perspective view showing a connection of the stand and the connection unit of the display apparatus in the upper-end area of the rear cover through hole according to an exemplary embodiment.

FIG. 5A is a schematic perspective view showing a connection of the stand and the connection unit of the display apparatus in the upper-end area of the rear cover through hole according to an exemplary embodiment.

Figure 5B:
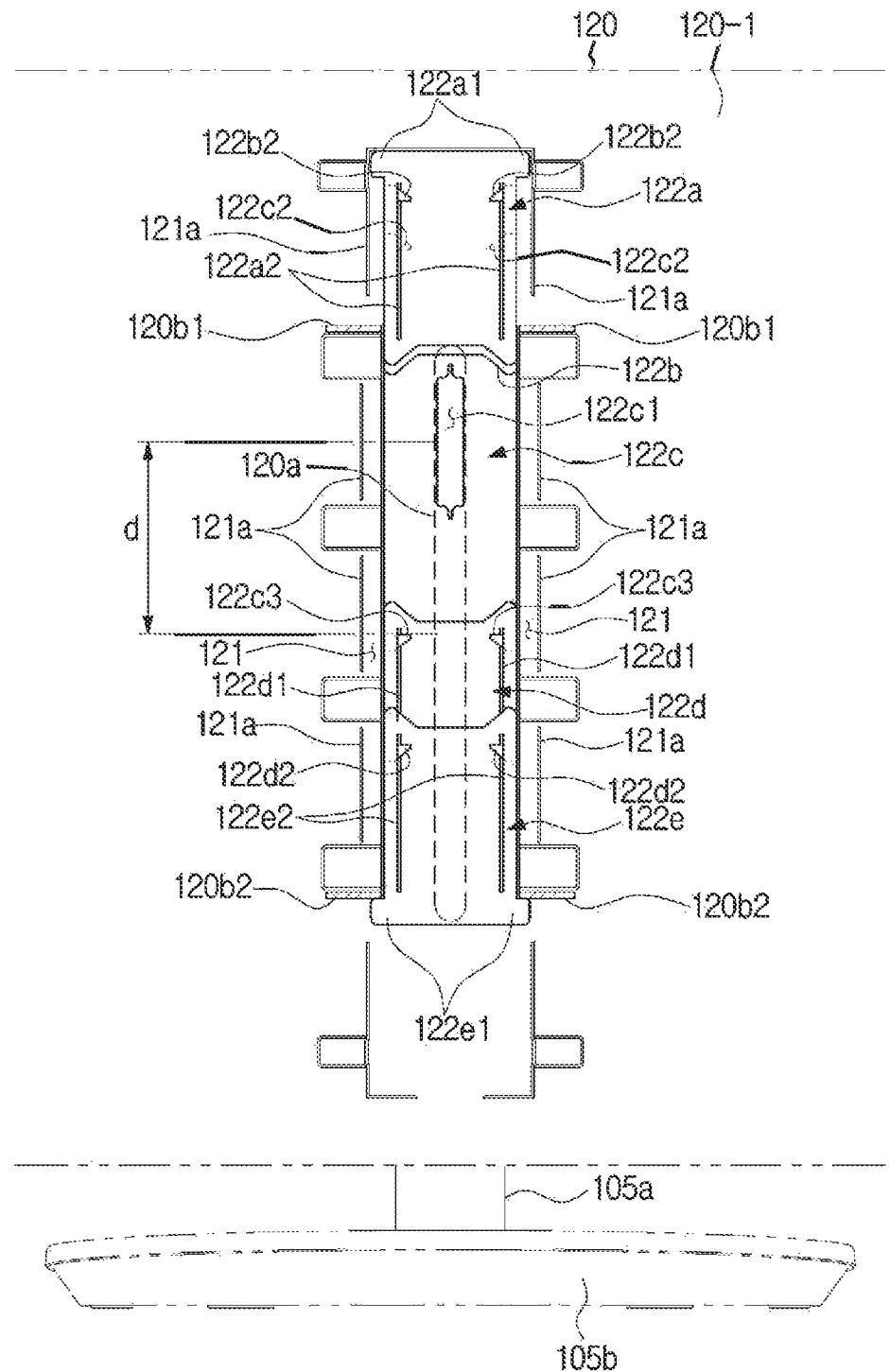
FIG. 5B is a schematic plan view showing the rear cover and the sheet corresponding to the connection of the stand and the connection unit of the display apparatus in the center area of the rear cover through hole according to an exemplary embodiment.

FIG. 5B is a schematic plan view showing the rear cover and the sheet corresponding to the connection of the stand and the connection unit of the display apparatus in the center area of the rear cover through hole according to an exemplary embodiment.

Referring to FIGS. 5A and 5B, the display unit 101 and the stand 105 are shown connected to each other in the upper-end area of the through hole 120a of the rear cover 120. More specifically, the display unit 101 may be connected to the stand 105 at the upper-end area of the guide rail 135a of the bracket rail 135.

The display unit 101 connected to the stand 105 in the center area of the through hole 120a of the rear cover 120, as shown in FIG. 4A, may move in an upward direction 139a by an external force.

When the display unit 101 moves in an upward direction 139a by an external force, the moving unit 139 may move in an upward direction 139a along the guide rail 135a having a curvature (for example, the second operation of the moving unit 139). When the display unit 101 moves in an upward direction 139a by the external force, the bracket link 131 of the moving unit 139 may also move upward along the through hole 120a.

When the bracket link 131 moves upward, the third sheet 122c contacting the bracket link 131 may move upward in correspondence to the movement of the bracket link 131 contacting the through hole 122c1. At this time, at least one sheet of the remaining sheets 122a, 122b, 122d, and 122e may move upward in correspondence to the movement of the third sheet 122c. Also, at least one sheet (for example, the first sheet 122a) of the remaining sheets 122a, 122b, 122d, and 122e may not move in correspondence to the movement of the third sheet 122c.

If the protrusion 134b of the stand support holder 134 of the moving unit 139 reaches the upper end of the guide rail 135a (or the upper end of the display unit 101), the movement of the moving unit 129 may be completed. If the bracket link 131 moving upward reaches the upper end of the through hole 120a, the movement of the bracket link 131 may be completed.

If the upward movement of the moving unit 139 is completed (or, if the upward movement of the bracket link 131 is completed), the movement of the sheet 122 may also be completed. Before the movement of the moving unit 139 is completed (or, before the movement of the bracket link 131 is completed), the protrusion 122e1 of the fifth sheet 122e of the sheet 122 may contact the protrusion 120b2.

If the protrusion 122e1 of the fifth sheet 122e of the sheet 122 contacts the protrusion 120b2, the movement of the fifth sheet 122e may be limited. Also, although the protrusion 122e1 of the fifth sheet 122e contacts the protrusion 120b2, the remaining sheets 122a to 122d except for the fifth sheet 122e may continue to move. For example, the fifth sheet 122e may move to 54 mm. The fifth sheet 122e may move to a distance that is, for example, longer than 40 mm and shorter than 60 mm. Also, the fifth sheet 122e may move to a distance that is, for example, longer than 47 mm and shorter than 72 mm. The above-mentioned movement distance of the fifth sheet 122e may be an example, and the movement distance of the fifth sheet 122e may change according to a connection structure.

When the upward movement of the moving unit 139 is completed (or, when the upward movement of the bracket link 131 is completed), a major area (for example, about 80%) of the first sheet 122a may overlap the second sheet 122b.

When the upward movement of the moving unit 139 is completed (or, when the upward movement of the bracket link 131 is completed), the hook 122b2, 122c2, 122c3, or 122d2 of each sheet may be located at the upper end of the groove 122a2, 122b1, 122d1, or 122e2 of the neighboring sheet.

The display unit 101 connected to the stand 105 in the upper-end area of the guide rail 135a of the bracket rail 135 may perform the first operation (for example, tilt) in arrow direction 139c to a certain angle (or a display angle, for example, an angle of 6 degrees forward with respect to the z-axis or an angle of −6 degrees backward with respect to the z-axis) in the arrow direction 139c with respect to the bracket shaft 133a as a reference axis. Also, the display unit 101 connected to the stand 105 in the upper-end area of the guide rail 135a of the bracket rail 135 may perform the first operation (for example, tilting) and the second operation (for example, sliding) to a certain angle (or a display angle, for example, an angle of 22 degrees forward with respect to the z-axis or an angle of −14 degrees backward with respect to the z-axis). Also, the display unit 101 connected to the stand 105 in the upper-end area of the guide rail 135a of the bracket rail 135 may perform the first operation (for example, tilt) and the second operation (for example, slide) to a certain angle (or a display angle, for example, an angle of 26 degrees forward with respect to the z-axis or an angle of −10 degrees backward with respect to the z-axis) in the arrow direction 139c with respect to the bracket shaft 133a as a reference axis.

However, these angles are examples, and the angles may change.

Figure 6A:
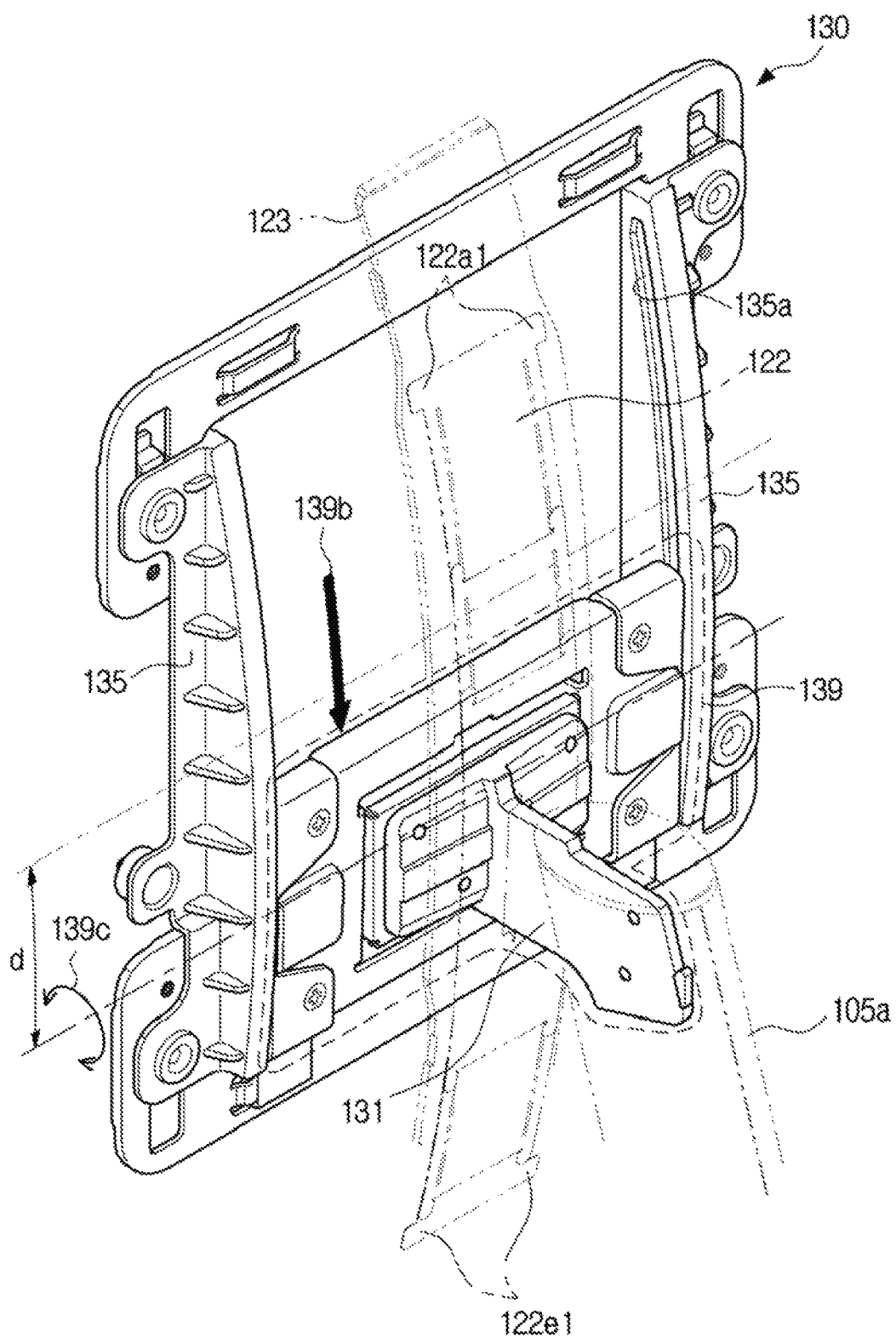
FIG. 6A is a schematic perspective view showing a connection of the stand and the connection unit of the display apparatus in the lower-end area of the rear cover through hole according to an embodiment.

FIG. 6A is a schematic perspective view showing a connection of the stand and the connection unit of the display apparatus in the lower-end area of the rear cover through hole according to an exemplary embodiment.

Figure 6B:
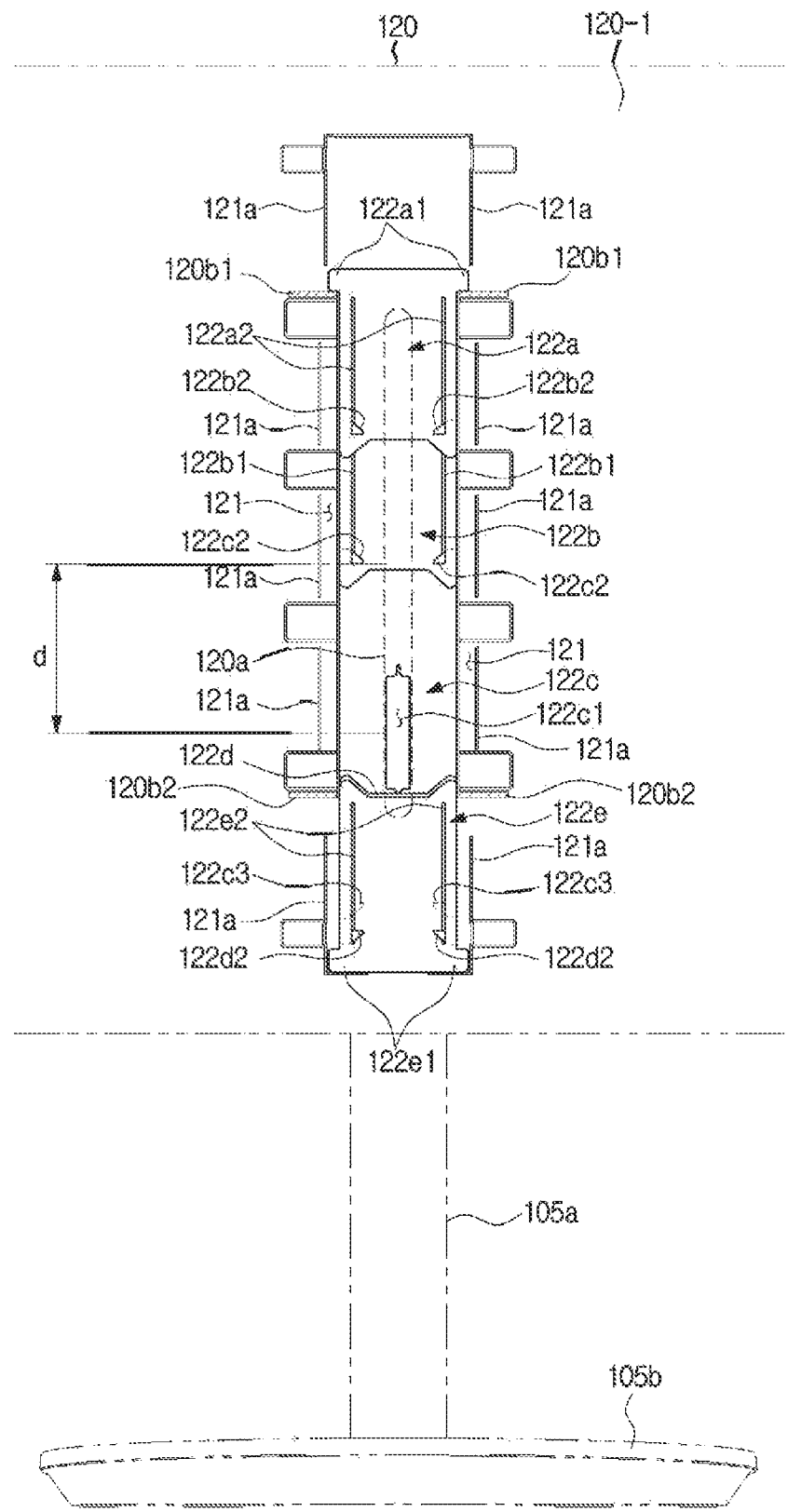
FIG. 6B is a schematic plan view showing the rear cover and the sheet corresponding to the connection of the stand and the connection unit of the display apparatus in the lower-end area of the rear cover through hole according to an exemplary embodiment.

FIG. 6B is a schematic plan view showing the rear cover and the sheet corresponding to the connection of the stand and the connection unit of the display apparatus in the lower-end area of the rear cover through hole according to an exemplary embodiment.

Referring to FIGS. 6A and 6B, the display unit 101 and the stand 105 connected to each other in the lower-end area of the through hole 120a of the rear cover 120 are shown. More specifically, the display unit 101 may be connected to the stand 105 at the lower-end area of the guide rail 135a of the bracket rail 135.

The display unit 101 connected to the stand 105 in the center area of the through hole 120a of the rear cover 120, as shown in FIG. 4A, may move in a downward direction 139b by an external force.

If the display unit 101 moves in a downward direction 139b by an external force, the moving unit 139 may move in a downward direction 139b along the guide rail 135a having a curvature (for example, the second operation of the moving unit 139). If the display unit 101 moves in a downward direction 139b by the external force, the bracket link 131 of the moving unit 139 may move downward along the through hole 120a.

When the bracket link 131 moves downward, the third sheet 122c contacting the bracket link 131 may move downward in correspondence to the movement of the bracket link 131 contacting the through hole 122c1. At this time, at least one sheet of the remaining sheets 122a, 122b, 122d, and 122e may move downward in correspondence to the movement of the third sheet 122c. Also, at least one sheet (for example, the fifth sheet 122e) of the remaining sheets 122a, 122b, 122d, and 122e may not move in correspondence to the movement of the third sheet 122c.

If the protrusion 134b of the stand support holder 134 of the moving unit 139 reaches the lower end of the guide rail 135a, the movement of the moving unit 139 may be completed (or the moving unit 139 reaches the lower end of the display unit 101). If the bracket link 131 moving downward reaches the lower end of the through hole 120a, the movement of the bracket link 131 may be completed.

When the downward movement of the moving unit 139 is completed (or, if the downward movement of the bracket link 131 is completed), the movement of the sheet 122 may also be completed. Before the movement of the moving unit 139 is completed (or, before the movement of the bracket link 131 is completed), the protrusion 122a1 of the first sheet 122a of the sheets 122a through 122e may contact the protrusion 120b1.

If the protrusion 122a1 of the first sheet 122a of the sheet 122 contacts the protrusion 120b1, the movement of the first sheet 122a may be limited. Also, although the protrusion 122a1 of the first sheet 122a contacts the protrusion 120b1, the remaining sheets 122b to 122e except for the first sheet 122a may continue to move. For example, the first sheet 122a may move to, for example, 54 mm. The first sheet 122a may move to a distance that is, for example, longer than 40 mm and shorter than 60 mm. Also, the first sheet 122a may move to a distance that is, for example, longer than 47 mm and shorter than 72 mm. The above-mentioned movement distance of the first sheet 122a may be an example, and the movement distance of the first sheet 122a may change according to the connection structure of the sheets 122.

When the downward movement of the moving unit 139 is completed (or, when the downward movement of the bracket link 131 is completed), a major area (for example, about 80%) of the fifth sheet 122e may overlap the fourth sheet 122d.

When the downward movement of the moving unit 139 is completed (or, when the downward movement of the bracket link 131 is completed, the hook 122b2, 122c2, 122c3, or 122d2 of each sheet may be located at the lower end of the groove 122a2, 122b1, 122d1, or 122e2 of the neighboring sheet.

The display unit 101 connected to the stand 105 in the lower-end area of the guide rail 135a of the bracket rail 135 may perform the first operation (for example, tilting) in an arrow direction 139c to a certain angle (for example, an angle of 6 degrees forward with respect to the z-axis or an angle of −6 degrees backward with respect to the z-axis) in the arrow direction 139c with respect to the bracket shaft 133a as a reference axis. Also, the display unit 101 connected to the stand 105 in the lower-end area of the guide rail 135a of the bracket rail 135 may perform the first operation (for example, tilting) and the second operation (for example, sliding) to a certain angle (for example, an angle of 34 degrees forward with respect to the z-axis or an angle of −2 degrees backward with respect to the z-axis). Also, the display unit 101 connected to the stand 105 in the lower-end area of the guide rail 135a of the bracket rail 135 may perform the first operation (for example, tilting) and the second operation (for example, sliding) to a certain angle (for example, an angle of 36 degrees forward with respect to the z-axis or an angle of 0 degrees backward with respect to the z-axis) in the arrow direction 139c with respect to the bracket shaft 133a as a reference axis. However, these angles are examples, and the angles may change.

According to an exemplary embodiment, the display apparatus 100 can provide a wide angle of view in the up-down direction by the operation (for example, the first operation or the second operation) of the connection unit 130 coupled with the bottom chassis 110 (or located in the inside of the display unit 101).

According to an exemplary embodiment, the display apparatus 100 can be easily repaired due to a simple stand structure (for example, a coupling structure of the base 105b and the stand neck 105a) and the connection unit 130 coupled with the bottom chassis 110 (or located in the inside of the display unit 101).

Although exemplary embodiments have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
    a chassis;
    a display panel provided on a first side of the chassis,
    a connection member coupled to a second side of the chassis, the connection member comprising a bracket link configured to couple the chassis to a stand; and
    a rear cover provided on the second side of the chassis, the rear cover comprising a first through hole through which the bracket link extends to couple the chassis to the stand,
    wherein the connection member is configured to tilt or slide the chassis with respect to the stand by movement of the bracket link along the first through hole.

2. The display apparatus according to claim 1, wherein the connection member comprises:
    a bracket holder coupled with the bracket link;
    a bracket plate coupled with the bracket holder through a bracket shaft and a fastener member, the bracket plate comprising a first edge and a second edge;
    a stand support holder coupled with the first edge and the second edge;
    a bracket rail including a guide rail corresponding to a protrusion of the stand support holder; and
    a bracket support coupled with the bracket rail, and coupled with the chassis.

3. The display apparatus according to claim 2, wherein the bracket holder coupled with the bracket link is configured to rotate on the bracket shaft with respect to the bracket plate.

4. The display apparatus according to claim 2, wherein the protrusion of the stand support holder is movably inserted in the guide rail.

5. The display apparatus according to claim 2, wherein the guide rail has a curvature.

6. The display apparatus according to claim 2, wherein a rotation angle of the bracket holder coupled with the bracket link depends on a position of the bracket plate with respect to the guide rail.

7. The display apparatus according to claim 2, wherein the fastener member of the bracket plate comprises an elastic member, and
    a rotation angle of the bracket holder coupled with the bracket link is limited by the elastic member.

8. The display apparatus according to claim 1, wherein the rear cover further comprises at least one sheet configured to cover at least a portion of the first through hole, and a holder sheet configured to fix the at least one sheet to the rear cover.

9. The display apparatus according to claim 8, wherein the at least one sheet comprises a plurality of sheets, and a first sheet of the plurality of sheets comprises a second through hole through which the bracket link extends.

10. The display apparatus according to claim 8, wherein the at least one sheet comprises a plurality of sheets, and a first sheet of the plurality of sheets is connected to a neighboring sheet of the plurality of sheets through a groove and a hook.

11. The display apparatus according to claim 8, wherein the at least one sheet comprises a plurality of sheets, and at least a first sheet of the plurality of sheets comprises a protrusion.

12. The display apparatus according to claim 8, wherein the at least one sheet comprises a plurality of sheets,
    wherein a first sheet of the plurality of sheets is configured to move in correspondence to a movement of the connection member, and a second sheet of the plurality of sheets is prevented from moving.

13. The display apparatus according to claim 1, wherein an upper end of a rear surface of the rear cover has a first curvature, and a center area of the rear surface of the rear cover has a second curvature different from the first curvature.

14. The display apparatus according to claim 1, wherein an upper end of a rear surface of the rear cover has a first curvature, and a lower end of the rear surface of the rear cover has a second curvature different from the first curvature.

15. A display apparatus comprising:
a display panel;
a chassis configured to accommodate the display panel on a first side of the chassis;
a connection member coupled to a second side the chassis, the connection member comprising a bracket link configured to couple the chassis to a stand; and
a rear cover having at least one curvature and provided on the second side of the chassis, the rear cover comprising a through hole through which the bracket link extends to couple the chassis to the stand,
wherein the connection member is configured to tilt or slide the chassis with respect to the stand.

16. A display apparatus comprising:
a display panel;
a chassis configured to accommodate the display panel on a first side of the chassis;
a stand configured to support the chassis;
a connection member coupled to a second side of the chassis and comprising a bracket link configured to couple the chassis to the stand, the connection member being configured to adjust a display angle of the chassis with respect to the stand; and
a rear cover provided on the second side of the chassis, the rear cover comprising a through hole through which the bracket link extends to couple the chassis to the stand,
wherein the bracket link is configured to move along the through hole in correspondence to an elevation of the connection member.

* * * * *